(12) United States Patent
Zeng et al.

(10) Patent No.: US 8,914,705 B1
(45) Date of Patent: Dec. 16, 2014

(54) PROBABILITY MAXIMUM TRANSITION RUN CODES

(71) Applicant: SK hynix memory solutions inc., San Jose, CA (US)

(72) Inventors: Lingqi Zeng, San Jose, CA (US); Yu Kou, San Jose, CA (US)

(73) Assignee: SK hynix memory solutions inc., San Jose, CA (US)

( * ) Notice: Subject to any disclaimer, the term of this patent is extended or adjusted under 35 U.S.C. 154(b) by 101 days.

(21) Appl. No.: 13/664,617

(22) Filed: Oct. 31, 2012

Related U.S. Application Data

(60) Provisional application No. 61/558,361, filed on Nov. 10, 2011.

(51) Int. Cl.
*G11C 29/00* (2006.01)
*H03M 7/00* (2006.01)
*H03M 13/00* (2006.01)
*G06F 11/10* (2006.01)
*H03M 7/28* (2006.01)

(52) U.S. Cl.
CPC ...... *H03M 7/28* (2013.01); *G06F 11/10* (2013.01)
USPC .......... 714/763; 341/58; 341/59; 341/63; 714/752

(58) Field of Classification Search
None
See application file for complete search history.

(56) References Cited

U.S. PATENT DOCUMENTS

| | | | | |
|---|---|---|---|---|
| 5,859,601 A | * | 1/1999 | Moon et al. | 341/59 |
| 6,104,324 A | * | 8/2000 | Kim | 341/58 |
| 6,526,530 B1 | * | 2/2003 | Nazari et al. | 714/701 |
| 7,388,523 B2 | * | 6/2008 | Itakura et al. | 341/58 |
| 7,530,003 B2 | * | 5/2009 | Lee et al. | 714/759 |

OTHER PUBLICATIONS

Li et al., An Improved Bit-Flipping Scheme to Achieve Run Length Control in Coded Systems, IEEE Transactions on Magnetics, Oct. 2005, pp. 2980-2982, vol. 41, No. 10.

* cited by examiner

*Primary Examiner* — Justin R Knapp
(74) *Attorney, Agent, or Firm* — Van Pelt, Yi & James LLP

(57) ABSTRACT

A plurality of random bit sequences is generated. Each of the random bit sequences is different and is based at least in part on an input bit sequence. A plurality of metrics corresponding to the plurality of random bit sequences is generated. The plurality of metrics is associated with one or more transition run lengths. One of the random bit sequences is selected based at least in part on the metrics. An output bit sequence is generated that includes the selected random bit sequence and an index associated with demodulating the selected random bit sequence.

25 Claims, 8 Drawing Sheets

PROBABILITY MAXIMUM TRANSITION RUN CODES

CROSS REFERENCE TO OTHER APPLICATIONS

This application claims priority to U.S. Provisional Patent Application No. 61/558,361 entitled PROBABILITY MAXIMUM TRANSITION RUN CODES filed Nov. 10, 2011 which is incorporated herein by reference for all purposes.

BACKGROUND OF THE INVENTION

Maximum transition run (MTR) codes limit the number of consecutive transitions in a bit sequence. For example, an MTR-3 code enforces a constraint where the maximum number of consecutive transitions is 3. A bit sequence of "10101" has 4 consecutive transitions and so (in one example) an MTR-3 modulator modifies the bit sequence to be "10111" (which reduces the number of consecutive transitions to 2).

Some MTR modulators input a bit sequence of length k and output a bit sequence of length n where n>k. This may require a clock that is n/k times faster than if MTR were not used. Making a semiconductor operate at a faster clock frequency is undesirable because it increases power consumption and/or increases the difficulty of timing closure (one of the steps in designing a semiconductor). Another issue is that when MTR codes are used in combination with error correction codes (ECC), such as Reed-Solomon codes and low-density parity-check (LDPC) codes, the MTR code may introduce error propagation into the system. New modulation codes which do not have these issues would be desirable.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
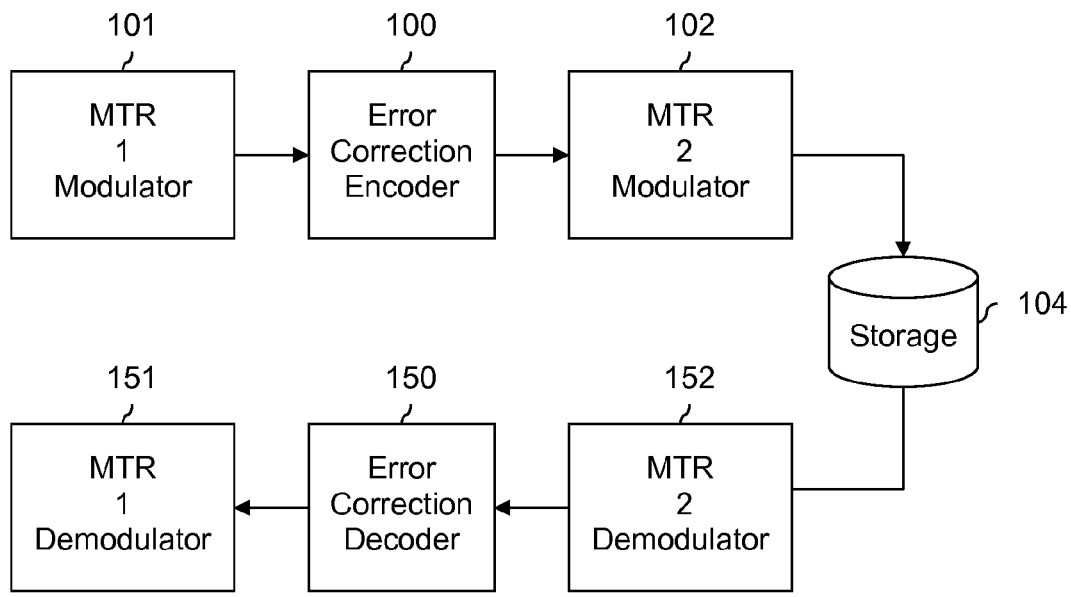
FIG. 1 is a diagram showing an example of a storage system that uses a maximum transition run (MTR) code and an error correction code.

FIG. 1 is a diagram showing an example of a storage system that uses maximum transition run (MTR) codes and an error correction code. In the example shown, a first maximum transition run (MTR) constraint is enforced by MTR 1 modulator (101). For example, if an MTR-4 constraint is enforced by MTR modulator 102, then consecutive transitions of length 5 or more are broken up, for example by flipping a bit in the middle of a run of offending consecutive transitions. Error correction encoder 100 encodes data the MTR 1 modulated data using an error correction code (e.g., a Reed-Solomon code, a low-density parity-check (LDPC) code, etc.). Error correction encoder 100 and decoder 150 have better performance when consecutive transitions (e.g., in a signal stored on storage 104) are limited. As such, prior to writing to storage 104, MTR modulator 2 102 enforces a second MTR constraint on the encoded data output by error correction encoder 100.

In various embodiments, storage 104 includes solid state storage (e.g., Flash) or magnetic storage (e.g., hard disk drive storage). Although not shown in FIG. 1, the probability maximum transition run technique described herein is applicable to both solid state and magnetic storage.

A read signal from storage 104 is passed to MTR 2 demodulator (152) which performs the inverse of MTR 2 modulator 102. The MTR 2 demodulated data is passed from MTR 2 demodulator (152) to error correction decoder 150 which performs error correction decoding. The error corrected data is then processed by MTR 1 demodulator (151).

One drawback of the example system shown is that the second MTR constraint can introduce error propagation into the system. In a worst case scenario, the error correction decoder 150 outputs a relatively long sequence of incorrectly decoded data because the error correction decoder 150 is continually fed bad information by MTR 2 demodulator (152). This is undesirable.

Another drawback of the example system shown is that a clock speed must increase to n/k times faster, where n>k. This is because overhead information (e.g., a tail used by MTR 2 demodulator 152 to demodulate the modulated data from storage 104) is added at MTR 2 modulator 102, but the system must still satisfy some (user) data rate. Permitting MTR 2 modulator 102 and MTR 2 demodulator 152 to operate at a 1× clock would slow down the observed user data rate (e.g., at the input of error correction encoder 100 and/or at the output of error correction decoder 150).

The following figures describe various embodiments of probability maximum transition run (PMTR) codes. Probability maximum transition run codes are attractive because they offer some of the advantages of MTR codes (e.g., they tend to reduce consecutive transitions which are undesirable for the reasons described above) but without some of the associated drawbacks.

Figure 2:
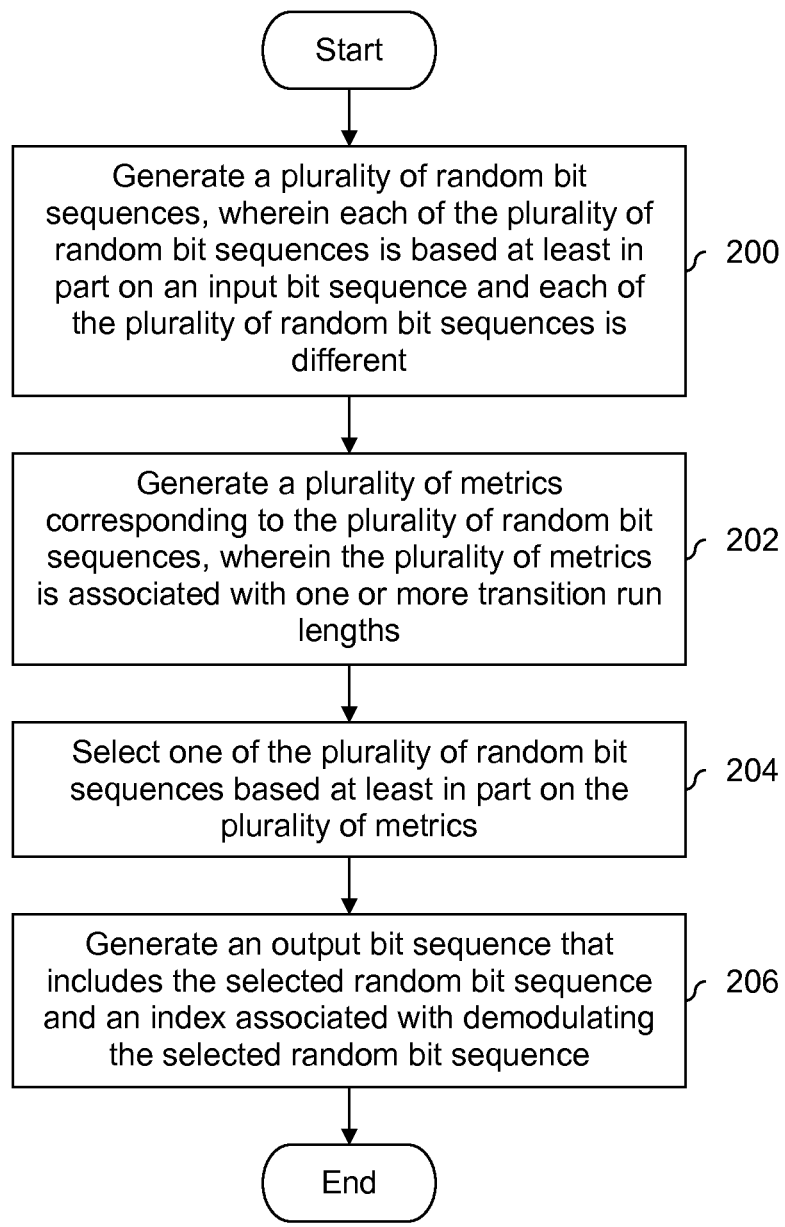
FIG. 2 is a flowchart illustrating an embodiment of a PMTR modulation process.

FIG. 2 is a flowchart illustrating an embodiment of a PMTR modulation process. In some embodiments, the process is performed by a semiconductor device, such as an application-specific integrated circuit (ASIC) or a field-programmable gate array (FPGA). In some embodiments, the example PMTR modulation process is used in a storage system (e.g., a solid state storage system or a magnetic storage system). For brevity, a corresponding PMTR demodulation process is not described in as much detail as embodiments of a PMTR modulation process are described.

At 200, a plurality of random bit sequences is generated, wherein each of the plurality of random bit sequences is based on a seed (or an index) and each of the plurality of random bit sequences is different. Any appropriate random bit sequence generation technique may be used. In some embodiments, the random bit sequences are generated using one technique (e.g., linear feedback shift registers). In some embodiments, the random bit sequences are pre-computed and stored in the memory.

At 202, a plurality of metrics is generated corresponding to the plurality of random bit sequences, wherein the plurality of metrics is associated with one or more transition run lengths. In some embodiments, a metric is the length of the longest transition run. In some embodiments, a metric is the number of transition runs of a certain length. In some embodiments, a metric is a weighted sum of the number of transition runs of various lengths (e.g., $\Sigma w_L \times number_L$).

One of the plurality of random bit sequences is selected based at least in part on the plurality of metrics at 204. For example, the random bit sequence having the best metric is selected. In some embodiments, if there is more than one metric having a best value, a secondary metric is generated for the tied random bit sequences and is used as a tie breaker. In one example, a primary metric is a weighted sum of the number of transition runs of various lengths and a secondary metric (if needed to break a tie) is the length of the longest transition run in a given tied random bit sequence.

At 206, an output bit sequence is generated that includes the selected random bit sequence and a seed (or an index) associated with demodulating the selected random bit sequence. In some embodiments, a seed is used to regenerate the random bit sequence which is used to demodulate the output bit sequence. In some embodiments, the index is used to access information from a table and the stored information is used to demodulate the output bit sequence. For example, an array of random bit sequence generators may be used at step 200 and each generator in the array is associated with a respective seed. In some embodiments, these seeds are stored in a table and it is determined which random bit sequence generator in the array was used during PMTR modulation. Alternatively, the seed is just the index and the seeds are not necessary stored.

Figure 3:
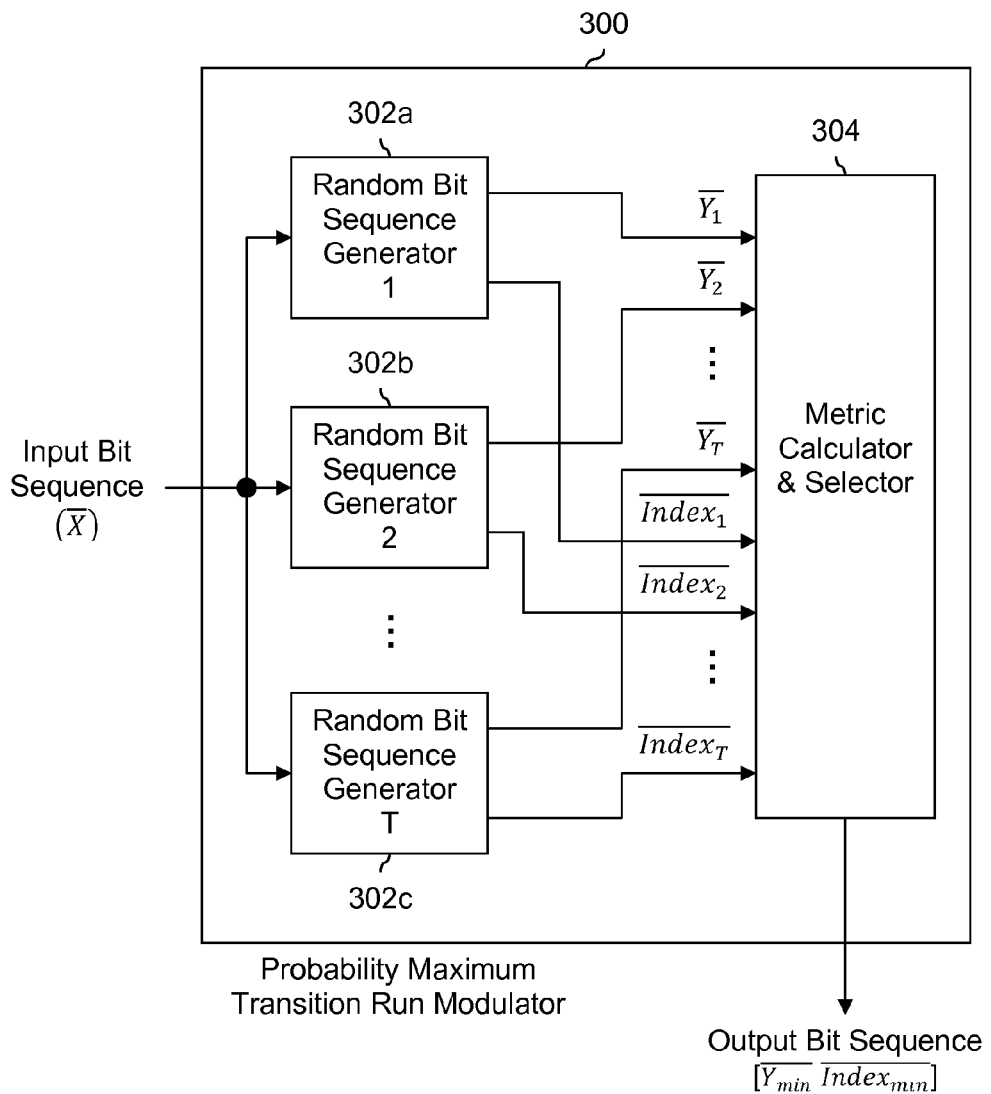
FIG. 3 is a diagram showing an embodiment of a PMTR modulator.

FIG. 3 is a diagram showing an embodiment of a PMTR modulator. In the example shown, PMTR encoder 300 performs the example process described in FIG. 2. An input bit sequence of length k ($\overline{X}=[X_0\ X_1\ \ldots\ X_k]$) is input to PMTR modulator 300. The input bit sequence is fed to each of random bit sequence generators 302a-302c. In this example, there are T random bit sequence generators, where $T=2^t$. Each of the random bit sequence generators generates a different random bit sequence of length k (that is, $\overline{Y}_0 \neq \overline{Y}_1 \neq \ldots \neq \overline{Y}_T$) when given the same input bit sequence.

The random bit sequences of length k and corresponding indices are passed from random bit sequences generators 302a-302c to metric calculator and selector 304 which generates an output bit sequence, $[\overline{Y}_{min}\ \overline{Index}_{min}]$. Metric calculation may be done in a variety of ways. In some embodiments, metric calculation is based only on the random bit sequences (i.e., $\overline{Y}_t$) and not the indices (i.e., $\overline{Index}_{min}$). In some embodiments, metric calculation takes into account both the random bit sequences and the indices. Some examples of metric calculation are described in further detail below.

Once the metrics are calculated, metric calculator and selector 304 selects the random bit sequence having the metric with the best value. In this example, a higher metric indicates a larger number of transition runs and/or longer transitions runs. As such, the metric with the lowest value is the best metric (at least in this example) since it indicates or corresponds to fewer transition runs and/or transition runs of shorter lengths. As such, metric calculator and selector 304 outputs the random bit sequence with the lowest metric $\overline{Y}_{min}$ (where $\overline{Y}_{min}$ is one of $\overline{Y}_0, \overline{Y}_1, \ldots, $ or $\overline{Y}_T$) with the corresponding index $\overline{Index}_{min}$ appended.

In some embodiments, an index included in an output bit sequence (e.g., $\overline{Index}_{min}$) is a generator identifier, for example a value between 1 and T indicating which random bit sequence generator generated the sequence that was selected by metric calculator and selector 304 and included in the output bit sequence. The output bit sequence is protected by the ECC and passed through the channel. After receiving the corrupted output bit sequence, the ECC corrects all of the error bits and recover the seed (or the index). Then, the seed (or the index) is passed to the PMTR demodulator. Using the seed (or the index), the chosen random bit sequence is regenerated using the seed (or a table is accessed using the index and the proper stored random bit sequence is retrieved) for PMTR demodulation. In some applications this is desirable if the length of the generator identifier (i.e., t since $2^t=T$ values can be uniquely represented by t bits) is less than the length of the seeds. For example, if seeds have a length of k (e.g., to match the length of input bit sequence $\overline{X}$) and if t<k then less overhead is inserted using this technique.

Alternatively, in some embodiments, an index included in an output bit sequence is a seed or some other value which is (e.g., directly) used to demodulate the PMTR modulated data.

Figure 4:
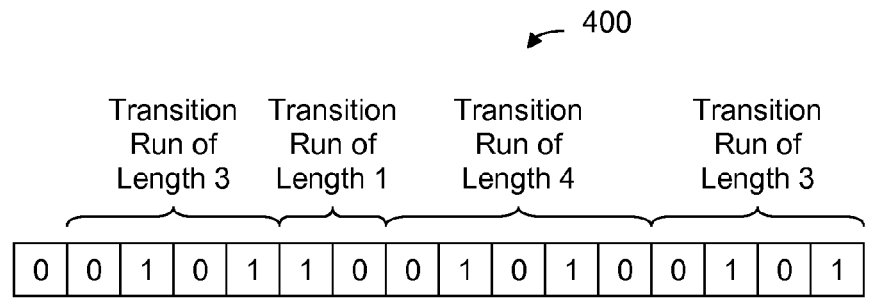
FIG. 4 is a diagram showing various embodiments of metrics.

FIG. 4 is a diagram showing various embodiments of metrics. Bit sequence 400 is an example bit sequence for which metrics of various types are calculated. In some embodiments, bit sequence 400 is just a random bit sequence and excludes an index associated with the random bit sequence. In some embodiments, bit sequence 400 includes a random bit sequence and an associated index. As shown in this figure, bit sequence 400 includes 1 transition run of length 4, 2 transition runs of length 3, no transition runs of length 2, and (for completeness) 1 transition run of length 1.

Metric calculation 410 shows an embodiment where a metric calculated using a weighted sum of transition runs. The weights for transition runs of lengths 4 through 0 are (respectively): $w_4=4$, $w_3=3$, $w_2=2$, and $w_1=0$. For the example weights and numbers of transition runs of various lengths, the weighted sum (and thus the metric) is 10. In some systems where error correction codes are used, the performance of the error correction code may decrease as the length of a transition run increases; weights used in a metric calculation may reflect and/or model the shape of this performance decrease. In some embodiments, a weighted sum is used as a primary metric.

Metric 420 shows an embodiment where a metric is the length of the longest transition run in a bit sequence. For bit sequence 400, the length of the longest transition run is 4 and so the metric is 4. In some embodiments, a length of a longest transition run in a bit sequence is used as a secondary metric (e.g., as a tie breaker in case there is more than one primary metric having the same highest/lowest value).

Figure 5:
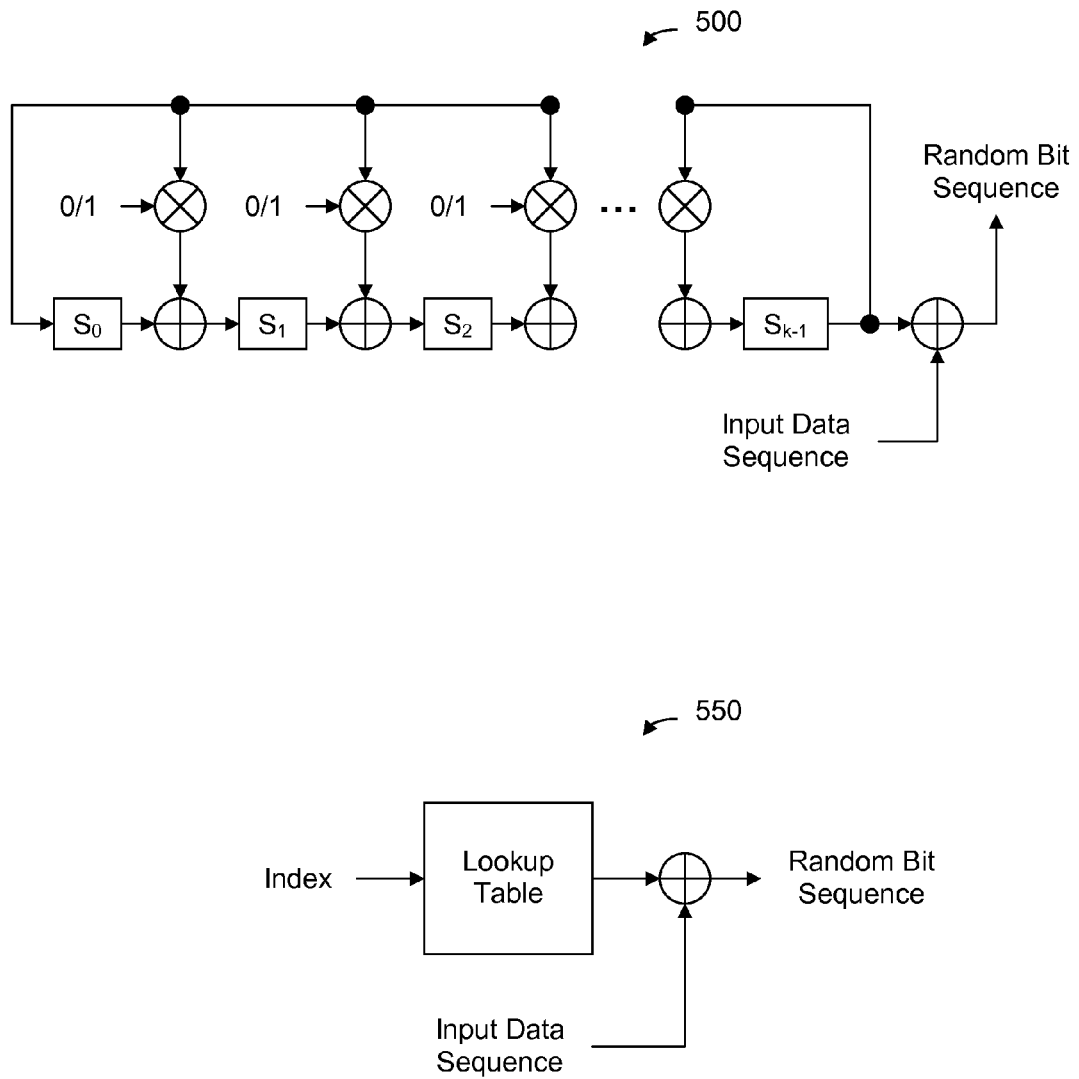
FIG. 5 is a diagram showing various embodiments of a random bit sequence generator.

FIG. 5 is a diagram showing various embodiments of a random bit sequence generator. In some embodiments, one or more of random bit sequence generators 302a-302c in FIG. 3 are implemented using random bit sequence generators 500 or 550. In diagram 500, a linear feedback shift register is shown. In this example, different random sequences are generated by loading different seeds. In one example, if 1024 different random bit sequences are desired, seeds which are 10 bits long are used. As long as k (i.e., the number of registers in linear feedback shift register 500) is no smaller than 10, a LFSR may be used to generate 1024 different random sequences. The extra (k−10) bits may be padded with any pattern.

Diagram 550 shows an example of a lookup table used to generate a random bit sequence. A sequence is retrieved from a lookup table using an index. The retrieved value is then XORed with the input data sequence to obtain a random bit sequence. In some embodiments, the contents of a lookup table are generated offline (e.g., before any input data is received for write processing). In some embodiments, the contents of a lookup table are generated using an index and/or error correction encoder. For example, the contents of a lookup table may be codewords of an error correction code.

Figure 6:
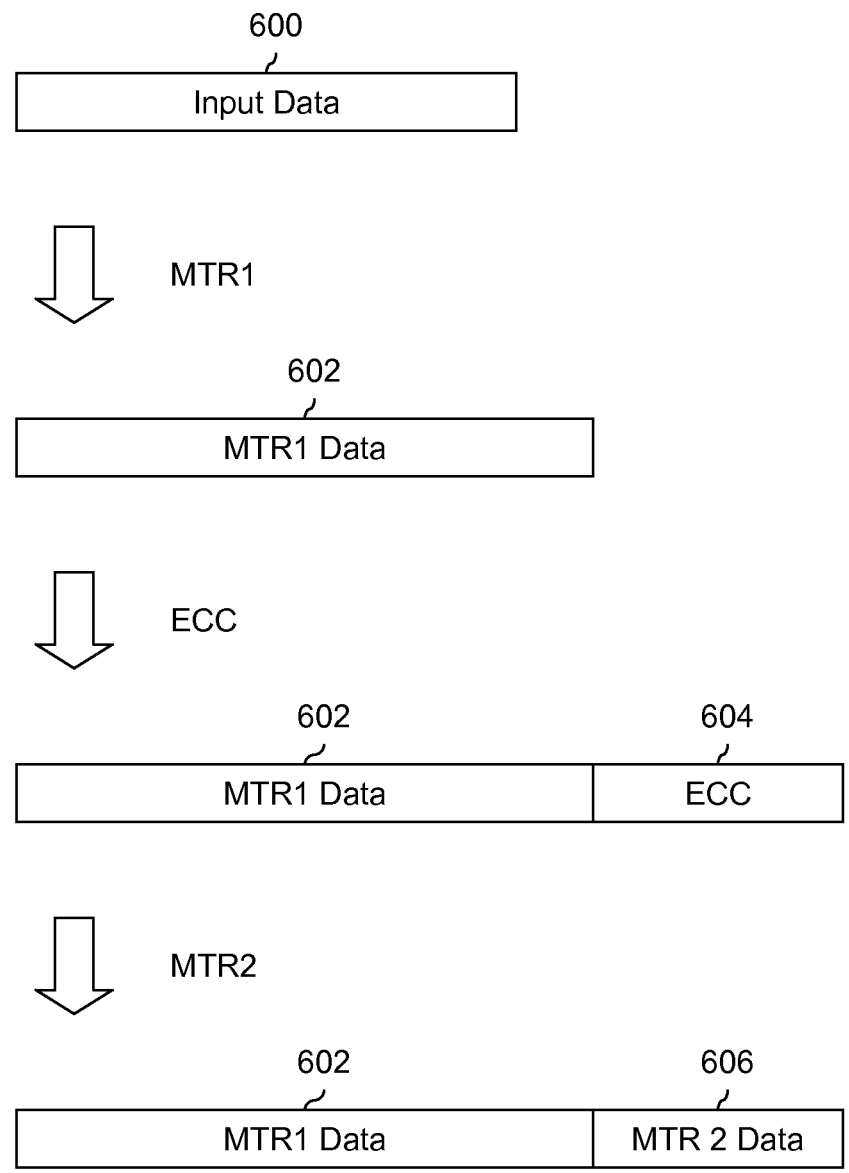
FIG. 6 is a diagram showing an example of MTR-modulated ECC parity information which permits the introduction of error propagation.

FIG. 6 is a diagram showing an example of MTR-modulated ECC parity information which permits the introduction of error propagation. In the example shown, input data 600 is processed with a first maximum transition run constraint. MTR 1 constrained data 602 is output. A systematic error correction code is then applied to the MTR 1 constrained data. ECC parity information 604 is appended to the end of the MTR 1 constrained data by the systematic error correction encoding process. A second MTR constraint is then applied, causing ECC parity information 604 to become MTR 2 constrained data 606. It is the second MTR constraint which causes error propagation at a corresponding read-related component (e.g., at or after a MTR 2 demodulator). This is undesirable. The following figures describe some embodiments where a PMTR modulator is configured in such a way that when combined with an ECC encoder, error propagation is avoided.

Figure 7:
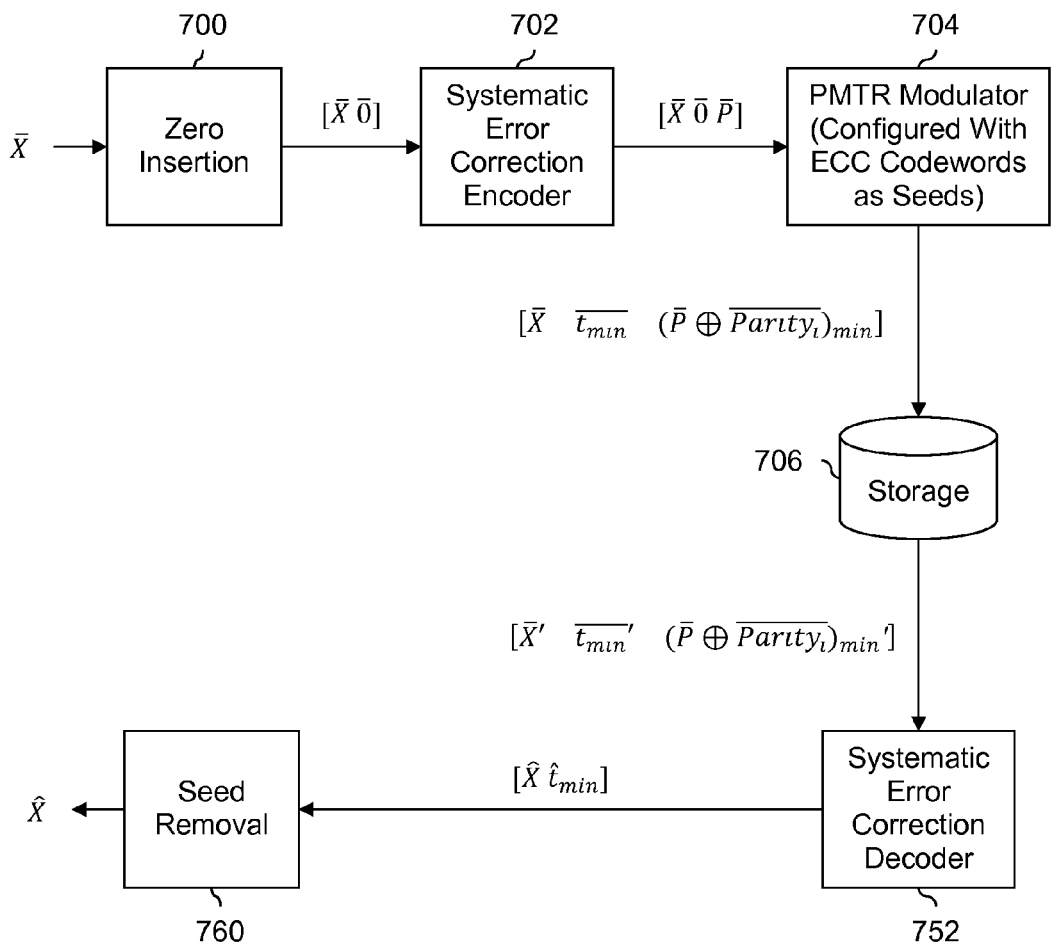
FIG. 7 is a diagram showing an embodiment of a storage system which uses PMTR modulation in combination with error correction encoding.

FIG. 7 is a diagram showing an embodiment of a storage system which uses PMTR modulation in combination with error correction encoding. In the example shown, error propagation is avoided because of the way PMTR modulator 704 is configured and the sequence in which error correction decoding and PMTR demodulation is performed by a read processor. In some embodiments, the system shown is implemented at least in part using a semiconductor device, such as an application-specific integrated circuit (ASIC) or a field-programmable gate array (FPGA). In various embodiments, storage 706 is solid state storage (e.g., Flash) or magnetic storage (e.g., magnetic disk storage).

Figure 8:
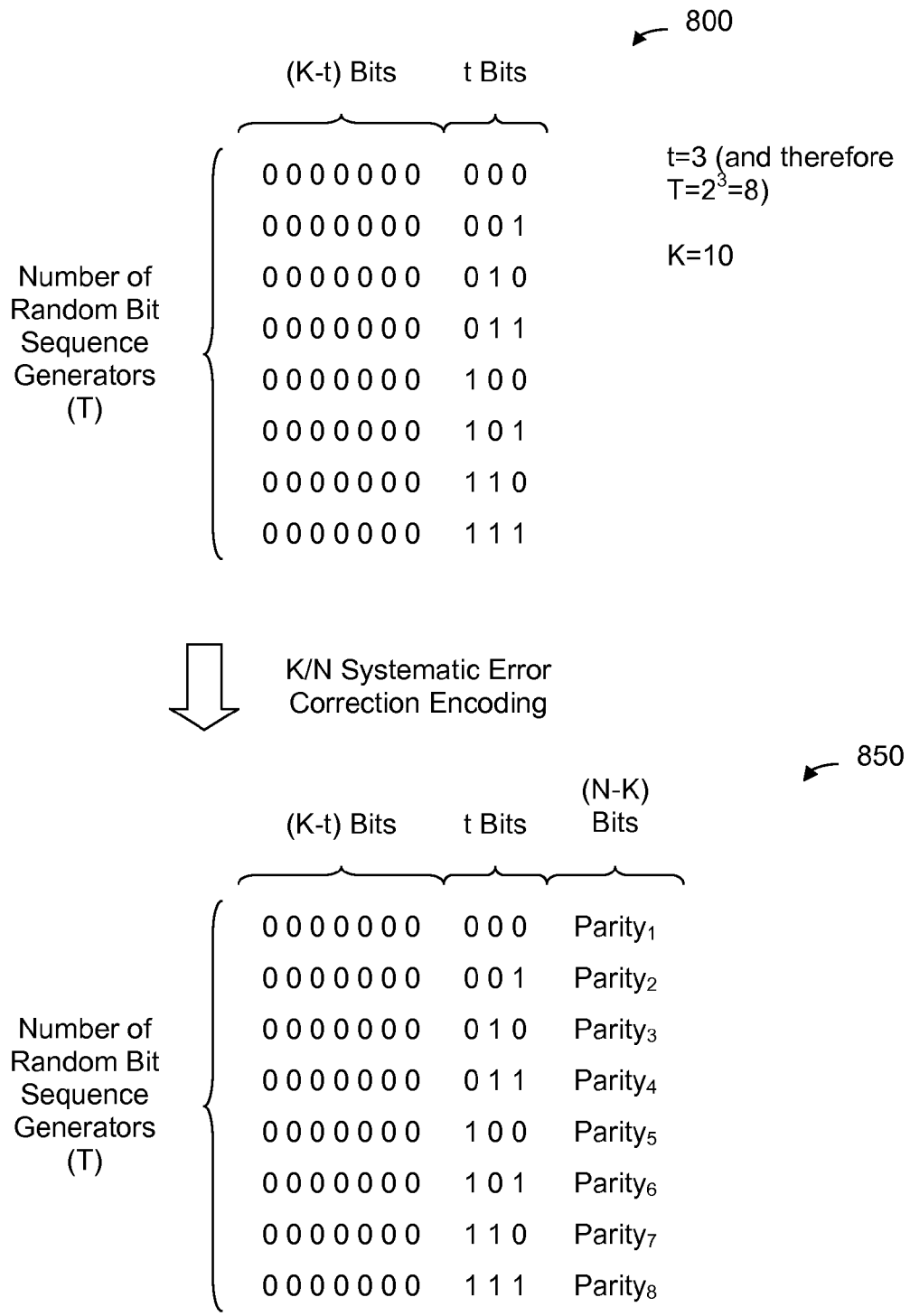
FIG. 8 is a diagram showing an embodiment of generation of scrambler sequences associated with a systematic error correction encoder.

First, before any data is processed by the system shown, PMTR modulator 704 is configured in the following exemplary manner. PMTR modulator 704 is implemented using an array of T scramblers (e.g., one scrambler embodiment is shown in random bit sequence generator 500 in FIG. 5). The index of each of the T scramblers, after padding 0's, is sent to systematic error correction encoder 702 to generate the ECC parities, which will be stored and used to modulate the input sequence. Each seed (at least in this example) is $\log_2(T)$ bits long. FIG. 8 is a diagram showing an embodiment of generation of scrambler sequences associated with a systematic error correction encoder. In the example shown, there are 8 random bit sequence generators (i.e., t=3 and thus $T=2^3=8$) and so in diagram 800, 8 rows which are K bits long are shown. The first (K−t) bits in the T bit sequences are all zeros; in this example K=10 and so (K−t)=7. The last t bits are a sweep of all possible values from 0 through T, which in this case is 0 through 7. So, the last 3 bits in the first row are 0 (in binary form), the last 3 bits in the second row are 1 (in binary form), and so on until the last 3 bits in the eighth row is 7 (in binary form).

The 8 bit sequences (each of which is K bits long) shown in 800 are input to a K/N rate systematic error correction encoder. The K/N rate indicates that K bits are input and N bits are output. A systematic error correction encoder includes the original/input data in the output and in this example the error correction parity information is appended at the end. In this example, seeds for PMTR modulator 704 in FIG. 7 are being generated and thus the systematic error correction encoder used in FIG. 8 is the same as encoder 702 in FIG. 7.

Diagram 850 shows the output of the systematic error correction encoder when the 8 bit sequences shown in 800 are input (e.g., one at a time to the error correction encoder). By definition, since the 8 bit sequences shown in diagram 850 are outputs of an error correction encoder, they are also codewords of that encoder. These 8 bits sequences (each of which is N bits long) shown in 850 are used as the scrambler sequences of PMTR modulator 704 in FIG. 7. For example, the first bit sequence in diagram 850 (i.e., $[\overline{0t_1 Parity_1}]$) is used the first scrambler in PMTR modulator 704 in FIG. 7, the second bit sequence in diagram 850 (i.e., $[\overline{0t_2 Parity_2}]$) is used as the second scrambler in PMTR modulator 704 in FIG. 7, and so on.

Once PMTR modulator 704 is configured as described above, the system shown in FIG. 7 may be used to store information in storage 706. Zero insertion block 700 appends a string of zeros to an input bit sequence. For example, if the input bit sequence is $\overline{X}$ then the output of step 702 is $[\overline{X}\ \overline{0}]$ where the input bit sequence $\overline{X}$ is (K−t) bits long (and so using the values in FIG. 8, (K−t) would be 10−3=7) and the string of zeros is t bits long (e.g., 3 bits long using the values from FIG. 8). The length of the sequence output by zero insertion block 700 is therefore K bits long.

The input bit sequence with the string of zeros appended is then encoded using systematic error correction encoder 702. To continue the above example, $[\overline{X}\ \overline{0}]$ is systematically encoded to produce $[\overline{X}\ \overline{0}\ \overline{P}]$ where $\overline{P}$ is the error correction coding parity information.

The error correction encoded information is then modulated using PMTR modulator 704. The specially chosen scrambler sequence (e.g., some embodiments of which are shown in diagram 850 in FIG. 8) will produce modulated data having the following values and properties. Since all of the scrambler sequences have a string of zeros for the first (K−t) bits, none of the scramblers (regardless of which one is selected according to a metric) will "flip" any of (K−t) bits in $\overline{X}$ and so $\overline{X}$ remains the same (i.e., $\overline{X} \oplus \overline{0} = \overline{X}$). Similarly, the string of zeros (t bits long) in the middle of [$\overline{X}$ $\overline{0}$ $\overline{P}$] will not cause any of middle t bits in diagram 850 in FIG. 8 to flip, so regardless of which scrambler output is selected, those t bits in the middle of the selected value will be one of $\bar{t}_1=0$; $\bar{t}_2=1$; . . . ; or $\bar{t}_8=7$. The t bits in the middle are referred to as $t_{min}$ and indicate which scrambler output was selected to have the best metric. The final (N−K) bits output by PMTR modulator 704 come from the ECC parity ($\overline{P}$) scrambled with the last (N−K) bits of the scrambler sequences; T possible values are generated (e.g., $\overline{P \oplus Parity_1}$; $\overline{P \oplus Parity_2}$; . . . ; $\overline{P \oplus Parity_8}$) and the one having the best metric is selected (i.e., $\overline{(P \oplus Parity_1)}_{min}$). Therefore, PMTR modulator 704 outputs [$\overline{Xt_{min}}$ $\overline{(P \oplus Parity_1)}_{min}$] which is a codeword associated with systematic error correction encoder 702. PMTR modulator 704 has the property that the same number of bits are output (i.e., N bits) as is input (i.e., N bits).

When the data is read back from storage 706, the data will includes some noise or errors; this indicated with a '. However, because the stored data is a codeword, it can be passed directly to systematic error correction decoder 752. The error correction decoder outputs decisions for $\overline{X}'$ and $\overline{t_{min}}'$ as $\hat{X}$ and $\hat{t}_{min}$. Seed removal 760 then removes the decision for the seed, $\hat{t}_{min}$, so that only the decision for the input data, $\hat{X}$, remains.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method for modulating data, comprising:
using a processor to generate a plurality of random bit sequences, wherein:
each of the plurality of random bit sequences is based at least in part on an input bit sequence and each of the plurality of random bit sequences is different; and
using the processor to generate the plurality of random bit sequences includes using a linear feedback shift register;
using the processor to generate a plurality of metrics corresponding to the plurality of random bit sequences, wherein the plurality of metrics is associated with one or more transition run lengths;
selecting one of the plurality of random bit sequences based at least in part on the plurality of metrics; and
generating an output bit sequence that includes the selected random bit sequence and an index associated with demodulating the selected random bit sequence.

2. The method of claim 1, wherein in the event more than one metric in the plurality of metrics has a best value:
the plurality of metrics is a plurality of primary metrics; and
selecting includes:
using the processor to generate a plurality of secondary metrics for those random bit sequences having a primary metric with a best value; and
selecting, from those random bit sequences having a primary metric with a best value, one based at least in part on the plurality of secondary metrics.

3. The method of claim 1, wherein using the processor to generate the plurality of random bit sequences includes using a look up table.

4. The method of claim 1, wherein the method is performed by a semiconductor device, including one or more of the following: an application-specific integrated circuit (ASIC) or a field-programmable gate array (FPGA).

5. A method for modulating data, comprising:
using a processor to generate a plurality of random bit sequences, wherein each of the plurality of random bit sequences is based at least in part on an input bit sequence and each of the plurality of random bit sequences is different;
using the processor to generate a plurality of metrics corresponding to the plurality of random bit sequences, wherein the plurality of metrics is associated with one or more transition run lengths;
selecting one of the plurality of random bit sequences based at least in part on the plurality of metrics; and
generating an output bit sequence that includes the selected random bit sequence and an index associated with demodulating the selected random bit sequence, wherein:
in the event more than one metric in the plurality of metrics has a best value:
the plurality of metrics is a plurality of primary metrics; and
selecting includes:
using the processor to generate a plurality of secondary metrics for those random bit sequences having a primary metric with a best value; and
selecting, from those random bit sequences having a primary metric with a best value, one based at least in part on the plurality of secondary metrics; and
the plurality of primary metrics includes a weighted sum based at least in part on a first weight associated with transition runs of a first length, a first number of transition runs of the first length, a second weight associated with transition runs of a second length, and a second number of transition runs of the second length.

6. The method of claim 5, wherein the plurality of secondary metrics includes a length of a longest transition run.

7. The method of claim 5, wherein the method is performed by a semiconductor device, including one or more of the following: an application-specific integrated circuit (ASIC) or a field-programmable gate array (FPGA).

8. A method for modulating data, comprising:
using a processor to generate a plurality of random bit sequences, wherein:
each of the plurality of random bit sequences is based at least in part on an input bit sequence and each of the plurality of random bit sequences is different; and
using the processor to generate the plurality of random bit sequences includes using a codeword associated with an error correction encoder;
using the processor to generate a plurality of metrics corresponding to the plurality of random bit sequences, wherein the plurality of metrics is associated with one or more transition run lengths;
selecting one of the plurality of random bit sequences based at least in part on the plurality of metrics;
generating an output bit sequence that includes the selected random bit sequence and an index associated with demodulating the selected random bit sequence; and
receiving the input bit sequence from the error correction encoder, wherein the input bit sequence is error correction encoded by the error correction encoder.

9. The method of claim 8, wherein the codeword associated with the error correction encoder includes a string of zeros.

10. The method of claim 8, wherein:
there are $2^t$ random bit sequences in the plurality of random bit sequences, wherein t is a positive integer;
using the processor to generate the plurality of random bit sequences further includes using a plurality of codewords associated with the error correction encoder;
the plurality of codewords include a string of zeros; and
the plurality of codewords include a string of bits having a value in the range of 0 through ($2^t-1$).

11. The method of claim 8, wherein the method is performed by a semiconductor device, including one or more of the following: an application-specific integrated circuit (ASIC) or a field-programmable gate array (FPGA).

12. A system for modulating data, comprising:
a processor; and
a memory coupled with the processor, wherein the memory is configured to provide the processor with instructions which when executed cause the processor to:
generate a plurality of random bit sequences, wherein:
each of the plurality of random bit sequences is based at least in part on an input bit sequence and each of the plurality of random bit sequences is different; and
the instructions for generating the plurality of random bit sequences include instructions for using a linear feedback shift register;
generate a plurality of metrics corresponding to the plurality of random bit sequences, wherein the plurality of metrics is associated with one or more transition run lengths;
select one of the plurality of random bit sequences based at least in part on the plurality of metrics; and
generate an output bit sequence that includes the selected random bit sequence and an index associated with demodulating the selected random bit sequence.

13. The system of claim 12, wherein in the event more than one metric in the plurality of metrics has a best value:
the plurality of metrics is a plurality of primary metrics; and
the instructions for selecting include instructions for:
generating a plurality of secondary metrics for those random bit sequences having a primary metric with a best value; and
selecting, from those random bit sequences having a primary metric with a best value, one based at least in part on the plurality of secondary metrics.

14. The system of claim 12, wherein the instructions for generating the plurality of random bit sequences include instructions for using a look up table.

15. The system of claim 12, wherein the system includes a semiconductor device, including one or more of the following: an application-specific integrated circuit (ASIC) or a field-programmable gate array (FPGA).

16. A system for modulating data, comprising:
a processor; and
a memory coupled with the processor, wherein the memory is configured to provide the processor with instructions which when executed cause the processor to:
generate a plurality of random bit sequences, wherein each of the plurality of random bit sequences is based at least in part on an input bit sequence and each of the plurality of random bit sequences is different;
generate a plurality of metrics corresponding to the plurality of random bit sequences, wherein the plurality of metrics is associated with one or more transition run lengths;
select one of the plurality of random bit sequences based at least in part on the plurality of metrics; and
generate an output bit sequence that includes the selected random bit sequence and an index associated with demodulating the selected random bit sequence, wherein:
in the event more than one metric in the plurality of metrics has a best value:
the plurality of metrics is a plurality of primary metrics; and
the instructions for selecting include instructions for:
generating a plurality of secondary metrics for those random bit sequences having a primary metric with a best value; and
selecting, from those random bit sequences having a primary metric with a best value, one based at least in part on the plurality of secondary metrics; and
the plurality of primary metrics includes a weighted sum based at least in part on a first weight associated with transition runs of a first length, a first number of transition runs of the first length, a second weight associated with transition runs of a second length, and a second number of transition runs of the second length.

17. The system of claim 16, wherein the plurality of secondary metrics includes a length of a longest transition run.

18. The system of claim 16, wherein the system includes a semiconductor device, including one or more of the following: an application-specific integrated circuit (ASIC) or a field-programmable gate array (FPGA).

19. A system for modulating data, comprising:
a processor; and
a memory coupled with the processor, wherein the memory is configured to provide the processor with instructions which when executed cause the processor to:
generate a plurality of random bit sequences, wherein:
each of the plurality of random bit sequences is based at least in part on an input bit sequence and each of the plurality of random bit sequences is different; and
the instructions for generating the plurality of random bit sequences include instructions for using a codeword associated with an error correction encoder;
generate a plurality of metrics corresponding to the plurality of random bit sequences, wherein the plurality of metrics is associated with one or more transition run lengths;
select one of the plurality of random bit sequences based at least in part on the plurality of metrics;
generate an output bit sequence that includes the selected random bit sequence and an index associated with demodulating the selected random bit sequence; and
to receive the input bit sequence from the error correction encoder, wherein the input bit sequence is error correction encoded by the error correction encoder.

20. The system of claim 19, wherein the codeword associated with the error correction encoder includes a string of zeros.

21. The system of claim 19, wherein:
there are $2^t$ random bit sequences in the plurality of random bit sequences, wherein t is a positive integer;

the instructions for generating the plurality of random bit sequences further include instructions for using a plurality of codewords associated with the error correction encoder;

the plurality of codewords include a string of zeros; and the plurality of codewords include a string of bits having a value in the range of 0 through ($2^t-1$).

22. The system of claim 19, wherein the system includes a semiconductor device, including one or more of the following: an application-specific integrated circuit (ASIC) or a field-programmable gate array (FPGA).

23. A computer program product for modulating data, the computer program product being embodied in a non-transitory computer readable storage medium and comprising computer instructions for:

generating a plurality of random bit sequences, wherein:
each of the plurality of random bit sequences is based at least in part on an input bit sequence and each of the plurality of random bit sequences is different; and
generating the plurality of random bit sequences includes using a linear feedback shift register;

generating a plurality of metrics corresponding to the plurality of random bit sequences, wherein the plurality of metrics is associated with one or more transition run lengths;

selecting one of the plurality of random bit sequences based at least in part on the plurality of metrics; and generating an output bit sequence that includes the selected random bit sequence and an index associated with demodulating the selected random bit sequence.

24. A computer program product for modulating data, the computer program product being embodied in a non-transitory computer readable storage medium and comprising computer instructions for:

generating a plurality of random bit sequences, wherein each of the plurality of random bit sequences is based at least in part on an input bit sequence and each of the plurality of random bit sequences is different;

generating a plurality of metrics corresponding to the plurality of random bit sequences, wherein the plurality of metrics is associated with one or more transition run lengths;

selecting one of the plurality of random bit sequences based at least in part on the plurality of metrics; and generating an output bit sequence that includes the selected random bit sequence and an index associated with demodulating the selected random bit sequence, wherein:

in the event more than one metric in the plurality of metrics has a best value:
the plurality of metrics is a plurality of primary metrics; and
selecting includes:
generating a plurality of secondary metrics for those random bit sequences having a primary metric with a best value; and
selecting, from those random bit sequences having a primary metric with a best value, one based at least in part on the plurality of secondary metrics; and the plurality of primary metrics includes a weighted sum based at least in part on a first weight associated with transition runs of a first length, a first number of transition runs of the first length, a second weight associated with transition runs of a second length, and a second number of transition runs of the second length.

25. A computer program product for modulating data, the computer program product being embodied in a non-transitory computer readable storage medium and comprising computer instructions for:

generating a plurality of random bit sequences, wherein:
each of the plurality of random bit sequences is based at least in part on an input bit sequence and each of the plurality of random bit sequences is different; and
generating the plurality of random bit sequences includes using a codeword associated with an error correction encoder;

generating a plurality of metrics corresponding to the plurality of random bit sequences, wherein the plurality of metrics is associated with one or more transition run lengths;

selecting one of the plurality of random bit sequences based at least in part on the plurality of metrics;

generating an output bit sequence that includes the selected random bit sequence and an index associated with demodulating the selected random bit sequence; and receiving the input bit sequence from the error correction encoder, wherein the input bit sequence is error correction encoded by the error correction encoder.

* * * * *

UNITED STATES PATENT AND TRADEMARK OFFICE
CERTIFICATE OF CORRECTION

PATENT NO. : 8,914,705 B1
APPLICATION NO. : 13/664617
DATED : December 16, 2014
INVENTOR(S) : Zeng et al.

Page 1 of 1

It is certified that error appears in the above-identified patent and that said Letters Patent is hereby corrected as shown below:

In the Claims

In column 10, Line 59, Claim 19, delete "to" before "receive"

Signed and Sealed this
Ninth Day of February, 2016

Michelle K. Lee
*Director of the United States Patent and Trademark Office*